United States Patent
Krishnamoorthy et al.

(10) Patent No.: US 9,748,738 B2
(45) Date of Patent: Aug. 29, 2017

(54) MULTIPLE-WAVELENGTH LASER

(71) Applicant: Oracle International Corporation, Redwood City, CA (US)

(72) Inventors: Ashok V. Krishnamoorthy, San Diego, CA (US); Xuezhe Zheng, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 0 days.

(21) Appl. No.: 14/625,971

(22) Filed: Feb. 19, 2015

(65) Prior Publication Data

US 2016/0072255 A1 Mar. 10, 2016

Related U.S. Application Data

(63) Continuation of application No. 12/820,833, filed on Jun. 22, 2010.

(51) Int. Cl.
*H01S 3/083* (2006.01)
*H01S 5/10* (2006.01)
(Continued)

(52) U.S. Cl.
CPC ........ *H01S 5/1096* (2013.01); *H01S 5/06821* (2013.01); *H04B 10/506* (2013.01);
(Continued)

(58) Field of Classification Search
CPC ... H04B 10/506; H01S 5/0078; H01S 5/1092; H01S 5/1096
(Continued)

(56) References Cited

U.S. PATENT DOCUMENTS

| | | | |
|---|---|---|---|
| 6,009,115 A | 12/1999 | Ho | |
| 7,965,949 B1 * | 6/2011 | Wach | H04J 14/04 398/143 |

(Continued)

OTHER PUBLICATIONS

Sanjoh, Hiroaki et al., "Multiwavelength Light Source with Precise Frequency Spacing Using a Mode-Locked Semiconductor Laser and an Arrayed Waveguide Grating Filter", IEEE Photonics Technology Letters, vol. 9, No. 6, Jun. 1997, pp. 818-820.

Delfyett, Peter J., et al., "Optical Frequency Combs From Semiconductor Lasers and Applications in Ultrawideband Signal Processing and Communications", Journal of Lightwave Technology, vol. 24, No. 7, Jul. 2006, pp. 2701-2719.

Fang, Alexander W., et al.,"A Distributed Bragg Reflector Silicon Evanescent Laser", IEEE Photonics Technology Letters, vol. 20, No. 20, Oct. 15, 2008, pp. 1667-1669.

Scott, R.P. et al., "3.5-THz Wide, 175 Mode Optical Comb Source", Optical Society of America, 2007.

Little, B.E. et al., "Very High-Order Microring Resonator Filters for WDM Applications", IEEE Photonics Technology Letters, vol. 16, No. 10, Oct. 2004, pp. 2263-2265.

(Continued)

*Primary Examiner* — Tod T Van Roy
(74) *Attorney, Agent, or Firm* — Park, Vaughan, Fleming & Dowler LLP

(57) ABSTRACT

In a multiple-wavelength laser source, a multiple-mode laser outputs a set of wavelengths in a range of wavelengths onto an optical waveguide, where a spacing between adjacent wavelengths in the set of wavelengths is smaller than a width of channels in an optical link. Furthermore, a set of ring-resonator filters in the multiple-wavelength laser source, which are optically coupled to the optical waveguide, output corresponding subsets of the set of wavelengths for use in the optical link based on free spectral ranges and quality factors of the set of ring-resonator filters. These subsets may include one or more groups of wavelengths, with another spacing between adjacent groups of wavelengths that is larger than the width of the given channel in the optical link. In addition, the one or more groups of wavelengths may include one or more wavelengths, with the spacing between adjacent wavelengths in the given group of wavelengths.

18 Claims, 6 Drawing Sheets

(51) Int. Cl.
*H04B 10/50* (2013.01)
*H01S 5/068* (2006.01)
*H01S 5/00* (2006.01)
*H01S 5/028* (2006.01)

(52) U.S. Cl.
CPC .......... *H01S 5/0078* (2013.01); *H01S 5/0085* (2013.01); *H01S 5/0287* (2013.01)

(58) Field of Classification Search
USPC .............................................. 372/20, 23, 94
See application file for complete search history.

(56) References Cited

U.S. PATENT DOCUMENTS 8,611,747 B1 * 12/2013 Wach ...................... H04J 14/04
398/79
2011/0170566 A1    7/2011 Holtom

OTHER PUBLICATIONS

Little, B.E. et al., "Ultra-Compact Si—SiO2 Microring Resonator Optical Channel Dropping Filters", IEEE Photonics Technology Letters, vol. 10, No. 4, Apr. 1998, pp. 549-551.
Guermache, Ali et al., "Over 0.7-W 14XX-NM FBG-Stabilised Output Power INP Based Pump Laser", 2005.
Wojcik, Gregory L. et al., "A single comb laser source for short reach WDM interconnects", SPIE vol. 7230, 2009.

* cited by examiner

US 9,748,738 B2

MULTIPLE-WAVELENGTH LASER

RELATED APPLICATION

This application is a continuation of, and hereby claims priority under 35 U.S.C. §120 to, pending U.S. patent application Ser. No. 12/820,833, entitled "Multiple Wavelength Laser," by inventors Ashok V. Krishnamoorthy and Xuezhe Zheng, filed on 22 Jun. 2010.

GOVERNMENT LICENSE RIGHTS

The United States Government has a paid-up license in this invention and the right in limited circumstances to require the patent owner to license others on reasonable terms as provided for by the terms of Agreement No. HR0011-08-9-0001 awarded by the Defense Advanced Research Projects Administration.

BACKGROUND

Field

The present disclosure relates to techniques for communicating optical signals. More specifically, the present disclosure relates to a multiple-wavelength laser that includes a multiple-mode laser and ring-resonator filters.

Related Art

Silicon photonics is a promising technology that can provide large communication bandwidth, low latency and low power consumption for inter- and intra-chip interconnects. In the last few years, significant progress has been made in developing low-cost components for use in inter- and intra-chip silicon-photonic interconnects, including: high-bandwidth efficient silicon modulators, low-loss optical waveguides, wavelength-division-multiplexing (WDM) components, and high-speed CMOS optical-waveguide photo-detectors. However, a suitable low-cost WDM laser source remains a challenge and poses an obstacle to implementing WDM silicon-photonic links.

In particular, existing WDM lasers (such as those used to transmit optical signals in WDM telecommunications systems) are usually very expensive and are typically single-wavelength sources. Because future WDM silicon-photonic links are expected to include thousands of optical channels (or more), the total cost of these WDM laser sources is likely to be prohibitive.

In addition, a variety of other techniques have been investigated to make a multiple-wavelength laser source. These approaches include an electrically pumped distributed-feedback laser array based on the hybrid bonding of III-V materials onto silicon. However, the yield and scaling of these laser arrays may make it difficult to obtain a low-cost laser source. In an alternative approach, a single broad-spectrum light emitter is used (such as: a superluminescent diode, a broadband laser, and a mode-locked comb laser) instead of the distributed-feedback laser array. Nonetheless, because of their size, cost and power consumption, the resulting laser sources also have not achieved a low-cost solution for use in a WDM silicon-photonic link. Furthermore, while a comb laser based on quantum dots has recently shown promise for transmitting wavelengths in the O band (1260-1360 nm), this laser source is not thought to be suitable for use in a WDM silicon-photonic link because of the limited availability of associated modulators and detectors.

Hence, what is needed is a multiple-wavelength laser source without the above-described problems.

SUMMARY

One embodiment of the present disclosure provides a multiple-wavelength laser source that includes a multiple-mode laser that outputs a set of wavelengths in a range of wavelengths, with a first spacing between a given pair of adjacent wavelengths that is smaller than a width of a given channel in an optical link. This multiple-mode laser includes: a gain medium, and a cavity, surrounding the gain medium, that has a first end with a reflecting mirror over the range of wavelengths and a second end with a partially reflecting mirror over the range of wavelengths. Moreover, the multiple-wavelength laser source includes: an optical waveguide optically coupled to the second end, and a set of ring-resonator filters optically coupled to the optical waveguide.

A given ring-resonator filter in the set of ring-resonator filters outputs a corresponding subset of the set of wavelengths for use in the optical link based on a free spectral range and a quality factor of the given ring-resonator filter. Furthermore, a given subset of the set of wavelengths includes at least a first group of wavelengths and, if the given subset of the set of wavelengths includes an adjacent second group of wavelengths, a second spacing between the first group of wavelengths and the second group of wavelengths is larger than the width of the given channel in the optical link. Additionally, a given group of wavelengths, which can include the first group of wavelengths or the second group of wavelengths, includes at least a first wavelength and, if the given group of wavelengths includes an adjacent second wavelength, the first wavelength and the second wavelength are separated by the first spacing, thereby facilitating optical modulation of the first group of wavelengths and the second group of wavelengths in the given subset of the set of wavelengths.

Note that the channel width may be 1.6 nm and the first spacing may be less than 1 nm. Moreover, the free spectral range of the given ring-resonator filter may correspond to a size of the given ring-resonator filter. In addition, the quality factor of the given ring-resonator filter may correspond to an optical coupling between the optical waveguide and the given ring-resonator filter, and a round-trip optical loss in the given ring-resonator filter.

In some embodiments, the given subset of the set of wavelengths includes the first group of wavelengths and the second group of wavelengths, and the given group of wavelengths only includes the first wavelength. For example, the first group of wavelengths may be associated with a first channel in the optical link, and the second group of wavelengths may be associated with a second channel in the optical link. Furthermore, the multiple-wavelength laser source may include: a first modulator that optically modulates the first group of wavelengths in the given subset of the set of wavelengths, and that outputs an optically modulated first group of wavelengths onto the optical link; and a second modulator that optically modulates the second group of wavelengths in the given subset of the set of wavelengths independently from the first modulator, and that outputs an optically modulated second group of wavelengths onto the optical link.

Alternatively, in some embodiments the given subset of the set of wavelengths only includes the first group of wavelengths, and the first group of wavelengths includes the first wavelength and the second wavelength. For example, the first group of wavelengths may be associated with a channel in the optical link. Furthermore, the multiple-wavelength laser source may include: the first modulator that optically modulates a first subset of the set of wavelengths, and that outputs a modulated first subset of the set of wavelengths; the second modulator that independently optically modulates a second subset of the set of wavelengths, and that outputs a modulated second subset of set of wavelengths; and a combiner that combines the modulated first subset of the set of wavelengths and the modulated second subset of the set of wavelengths, and that outputs a combined optical signal onto the optical link.

Additionally, the multiple-wavelength laser source may be disposed on an integrated circuit. For example, the optical waveguide and the set of ring-resonator filters may be defined in a semiconductor layer (such as silicon) in the integrated circuit. Furthermore, the multiple-wavelength laser source may include a substrate and a buried-oxide layer deposited on the substrate, where the semiconductor layer is disposed on the buried-oxide layer.

In some embodiments, the multiple-mode laser includes a Fabry-Perot laser.

In some embodiments, the multiple-wavelength laser source includes a polarization-control element that stabilizes polarization over the range of wavelengths. For example, the polarization-control element may be between the multiple-mode laser and the optical waveguide. Alternatively, the polarization-control element may be included in the multiple-mode laser. In these latter embodiments, the polarization-control element may be included in the reflecting mirror and/or the partially reflecting mirror. Note that in some embodiments the optical waveguide selects the polarization over the range of wavelengths.

Another embodiment provides a system that includes the multiple-wavelength laser source.

Another embodiment provides a method for outputting a set of wavelengths. During this method, the set of wavelengths in the range of wavelengths are generated using the multiple-mode laser, where the first spacing between the pair of adjacent wavelengths in the set of wavelengths is smaller than the width of the given channel in the optical link. Then, the set of wavelengths is conveyed in the optical waveguide that is optically coupled to the laser. Next, the first subset of the set of wavelengths is output for use in the optical link using the first ring-resonator filter coupled to the optical waveguide, and the second subset of the set of wavelengths is output for use in the optical link using the second ring-resonator filter coupled to the optical waveguide. Note that the first subset of the set of wavelengths is output based on a first free spectral range and a first quality factor of the first ring-resonator filter, and the second subset of the set of wavelengths is output based on a second free spectral range and a second quality factor of the second ring-resonator filter.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

Embodiments of a multiple-wavelength laser source, a system that includes the multiple-wavelength laser source, and a technique for outputting a set of wavelengths using the multiple-wavelength laser source are described. In the multiple-wavelength laser source, a multiple-mode laser outputs a set of wavelengths in a range of wavelengths onto an optical waveguide, where a spacing between adjacent wavelengths in the set of wavelengths is smaller than a width of channels in an optical link. Furthermore, a set of ring-resonator filters in the multiple-wavelength laser source, which are optically coupled to the optical waveguide, output corresponding subsets of the set of wavelengths for use in the optical link based on free spectral ranges and quality factors of the set of ring-resonator filters. These subsets may include one or more groups of wavelengths, with another spacing between adjacent groups of wavelengths that is larger than the width of the given channel in the optical link. In addition, the one or more groups of wavelengths may include one or more wavelengths, with the spacing between adjacent wavelengths in the given group of wavelengths. In this way, the multiple-wavelength laser source facilitates optical modulation of the one or more groups of wavelengths in the given subset of the set of wavelengths.

By using the high-power multiple-mode laser and the cascaded ring-resonator filters (which function as wavelength slicers), a low-cost multiple-wavelength laser source may be implemented for use in a WDM silicon-photonic link. This multiple-wavelength laser source may output the multiple wavelengths in a common optical waveguide or in separate optical waveguides for different wavelengths, thereby supporting a variety of configurations and architectures. Consequently, the multiple-wavelength laser source may help facilitate high-speed inter- and intra-chip silicon-photonic interconnects, as well as associated systems that can include this component (such as high-performance computing systems).

In the discussion that follows, a Fabry-Perot laser is used as an illustrative example of the multiple-mode laser. However, in other embodiments a wide variety of lasers may be used, including: a gain element capable of lasing, a semiconductor laser, a laser that receives and outputs light from the same facet, etc. Furthermore, in some embodiments the multiple-mode laser may be replaced by a non-lasing optical source, such as a semiconductor optical amplifier.

Figure 1:
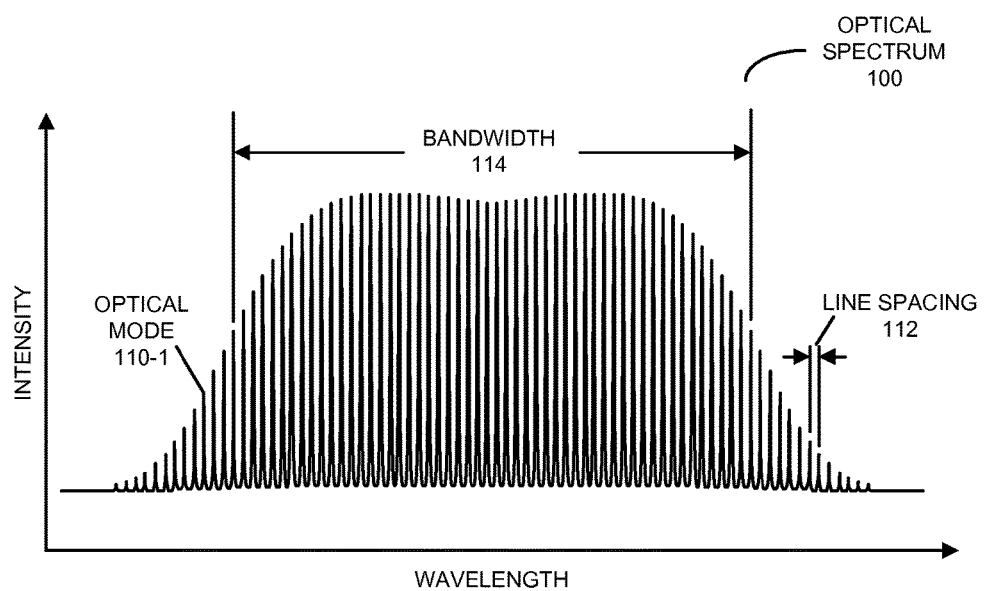
FIG. 1 is a drawing of an output spectrum of a Fabry-Perot laser that has multiple longitudinal optical modes in accordance with an embodiment of the present disclosure.

We now describe embodiments of the multiple-wavelength laser source. A high-power laser based on a multiple-quantum-well Fabry-Perot structure can generate up to a few hundred to a thousand milliwatts of optical power coupled into an optical waveguide or fiber. Without a fiber Bragg grating, these E-band (1360-1460 nm) or C-band (1530-1565 nm) Fabry-Perot lasers typically have an optical bandwidth in excess of 10 nm (or 15-20 nm) that includes many longitudinal optical modes. This is illustrated in FIG. 1, which presents a drawing of an output spectrum 100 of a Fabry-Perot laser that has multiple longitudinal optical modes (such as optical mode 110-1) separated by a line spacing 112. Note that these lasing wavelengths are modulated by the gain of the active gain medium in the laser cavity (i.e., these are the wavelengths the gain medium will support), thereby defining bandwidth 114 (and a range of wavelengths 314 in FIGS. 3 and 4).

Figure 2:
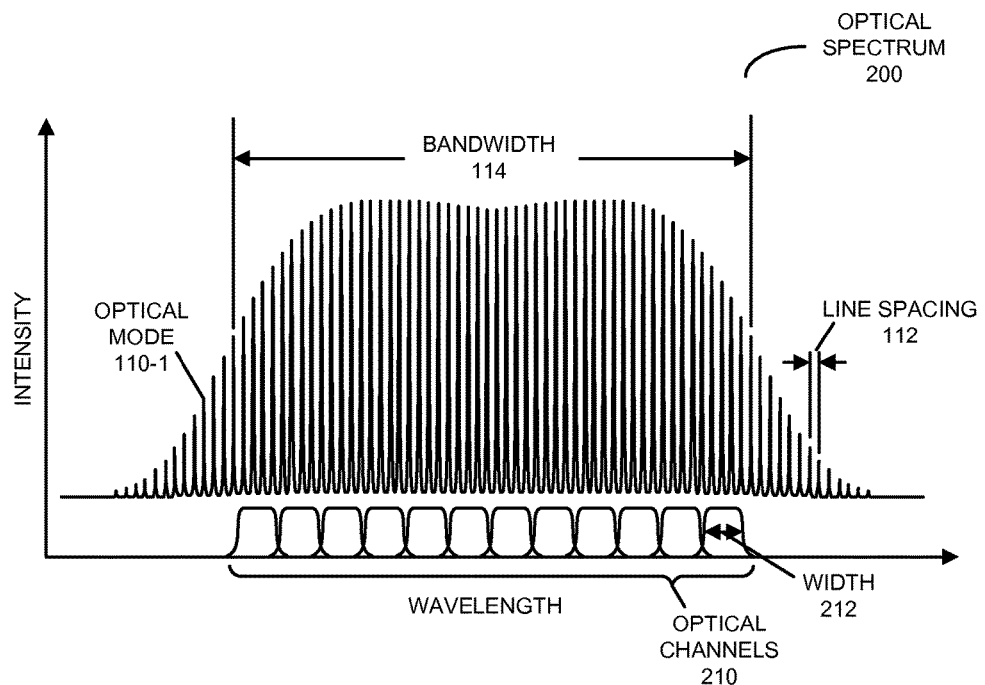
FIG. 2 is a drawing of an output spectrum of a multiple-wavelength laser source that uses narrow-band wavelength filters to slice the output spectrum of FIG. 1 in accordance with an embodiment of the present disclosure.

However, it may be difficult to independently modulate different wavelengths in optical spectrum 100 given line spacing 112. In principle, this problem could be addressed using narrow-bandwidth wavelength filters to slice the broad spectrum of the high-power Fabry-Perot laser to provide a multiple-wavelength laser source. This is illustrated in FIG. 2, which presents a drawing of an output spectrum 200 of a multiple-wavelength laser source that uses narrow-band wavelength filters to slice output spectrum 100 (FIG. 1) into optical channels 210 having width 212.

When slicing output spectrum 100 (FIG. 1), it is often desirable for each of the narrow-band wavelength filters to pick off one associated high-gain wavelength for use in a given optical channel. However, there typically is a tradeoff between line spacing 112 in FIG. 1 and the gain of the Fabry-Perot laser. In particular, if a longer cavity is used the gain (and thus the output power) is increased, at the cost of a smaller line spacing 112. For example, in FIG. 1, with a laser cavity length of 1 mm, line spacing 112 is around 0.2 nm. Alternatively, when a shorter cavity is used line spacing 112 is increased, but if the cavity is too short the gain may be insufficient. Balancing the tradeoff between line spacing 112 and the gain to obtain one wavelength per optical channel is often challenging in a multiple-wavelength laser source, which can make it difficult to pick off or drop wavelengths using narrow-band wavelength filters.

Figure 3:
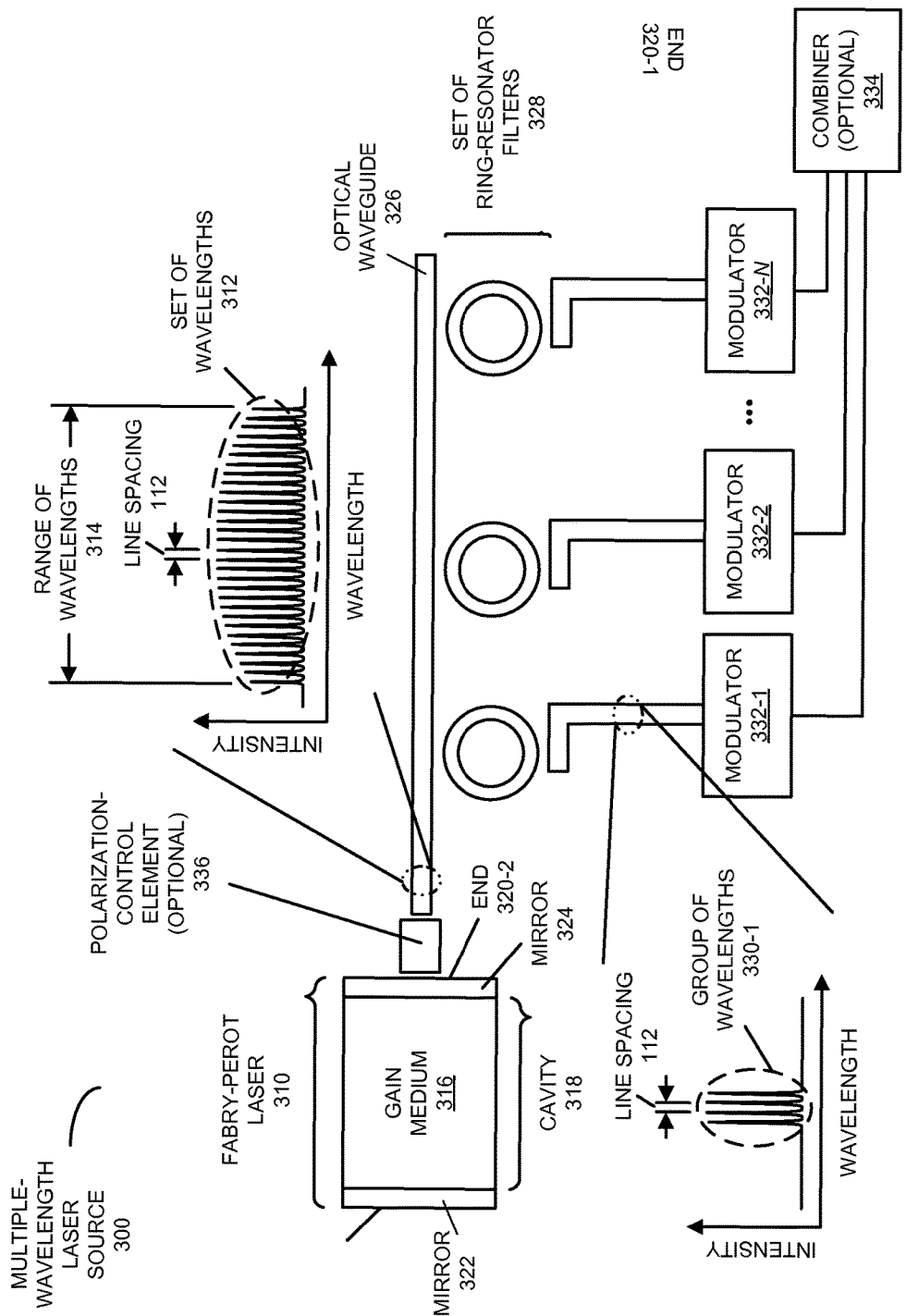
FIG. 3 is a block diagram illustrating a multiple-wavelength laser source in accordance with an embodiment of the present disclosure.

FIG. 3 presents a block diagram illustrating a multiple-wavelength laser source 300 that addresses these challenges. This multiple-wavelength laser source includes a Fabry-Perot laser 310 that outputs a set of wavelengths 312 in a range of wavelengths 314, with line spacing 112 between a given pair of adjacent wavelengths in set of wavelengths 312 that is smaller than a width of a given optical channel in an optical link (such as width 212 in FIG. 2).

Furthermore, Fabry-Perot laser 310 may include: a gain medium 316, and a cavity 318, surrounding gain medium 316, which has an end 320-1 with a reflecting mirror 322 over range of wavelengths 314 and an end 320-2 with a partially reflecting mirror 324 over range of wavelengths 314. (Note that the combination of mirrors 322 and 324 defines a spatial extent of cavity 318.) For example, mirror 322 may be 100% reflecting over range of wavelengths 314, and mirror 324 may be 99.95% reflecting over range of wavelengths 314. Moreover, multiple-wavelength laser source 300 may include: an optical waveguide 326 (which is sometimes referred to as a bus waveguide) optically coupled to end 320-2, and a set of ring-resonator filters 328 optically coupled to optical waveguide 326.

Figure 4:
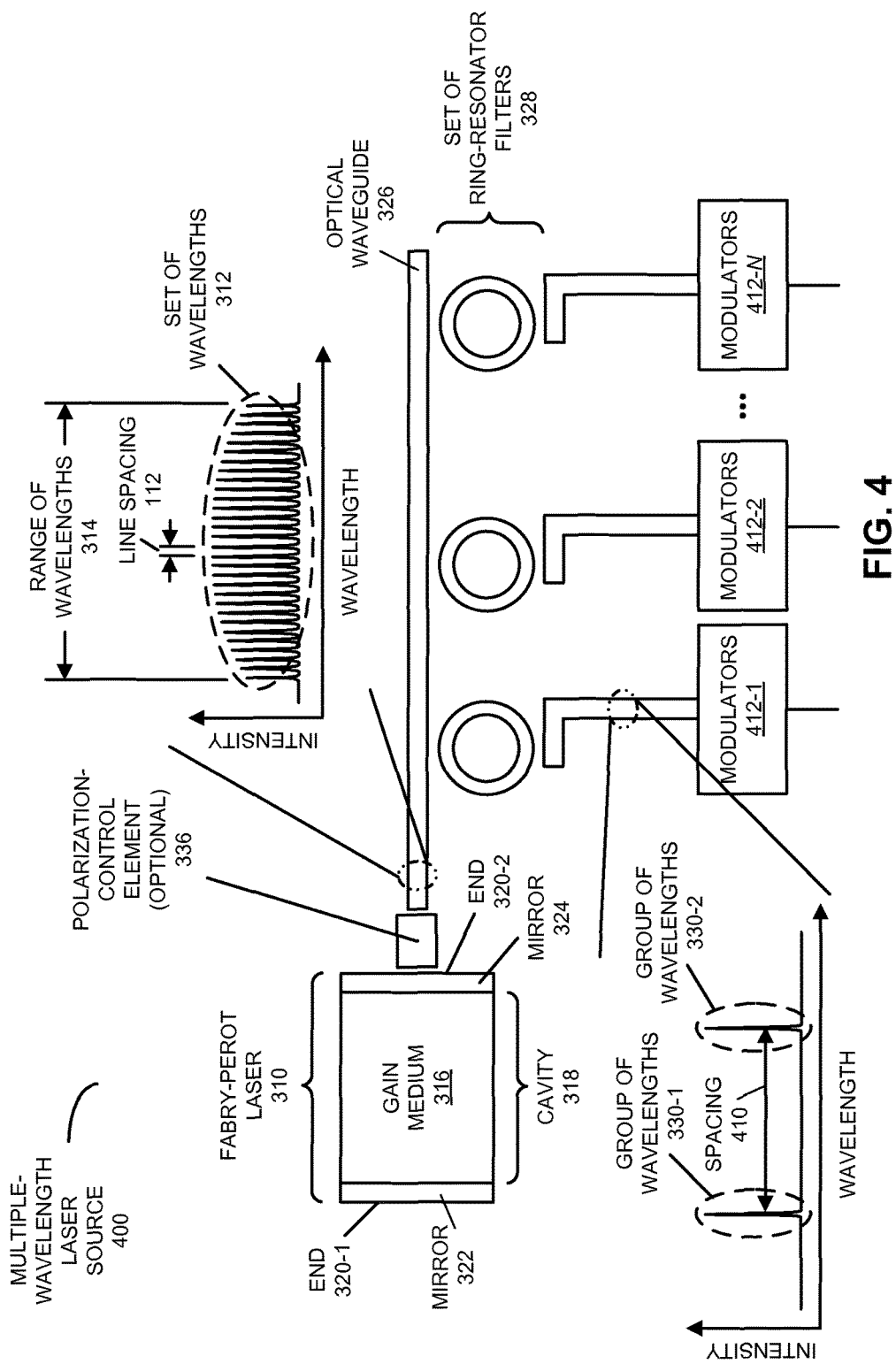
FIG. 4 is a block diagram illustrating a multiple-wavelength laser source in accordance with an embodiment of the present disclosure.

These ring-resonator filters may have high quality (Q) factors and narrow bandwidths so that they can each pick out an associated single wavelength or a subset of set of wavelengths 312 (which, as discussed below, may include one or more groups of wavelengths 330). In particular, a given ring-resonator filter in set of ring-resonator filters 328 may output a given subset of set of wavelengths 312 for use in the optical link based on a free spectral range and a Q factor of the given ring-resonator filter. As shown in FIG. 4, if multiple groups of wavelengths 330 output by the given ring-resonator filter are within bandwidth 114 in FIG. 1, the free spectral range may determine a spacing 410 between these groups of wavelengths (otherwise, as shown in FIG. 3, there is only one group of wavelengths, such as group of wavelengths 330-1, in a given subset of set of wavelengths 312). Moreover, the Q factor may determine the width of the filter, and thus the sharpness of groups of wavelengths 330. Note that the free spectral range of the given ring-resonator filter may be specified by or may be a function of a size (or the radius) of the ring resonator in the given ring-resonator filter. In addition, the Q factor of the given ring-resonator filter may be specified by or may be a function of an optical coupling between optical waveguide 326 and the ring resonator in the given ring-resonator filter, and a round-trip optical loss in the given ring-resonator filter.

Therefore, by cascading multiple ring-resonator filters having slightly different ring sizes (or identically sized rings that are tuned to different resonant wavelengths), set of ring-resonator filters 328 may form a combined wavelength filter that outputs the multiple wavelengths for use in optical channels 210 in FIG. 2.

In some embodiments, a given ring-resonator filter in set of ring-resonator filters 328 has a free spectral range that is larger than bandwidth 114 in FIG. 1. As discussed previously, in these embodiments there is only one group of wavelengths (such as group of wavelengths 330-1) in a given subset of set of wavelengths 312 output by the given ring-resonator filter. This group of wavelengths may include multiple wavelengths in which adjacent wavelengths are separated by line spacing 112.

Moreover, the outputs from set of ring-resonator filters 328 may be used in corresponding optical channels in the optical link. For example, the group of wavelengths (such as group of wavelengths 330-1) output by the given ring-resonator filter may be optically modulated by one of modulators 332 (such as modulator 332-1) to encode data for a given optical channel onto wavelengths in the group of wavelengths. This modulation may be independent of that performed by other modulators on the outputs from other ring-resonator filters. After the subsets of set of wavelengths 312 have been modulated, the modulated optical signals may be combined by optional combiner 334 and output onto a common optical link (not shown). (Note that, in general, the optical signals can be modulated before or after combining.)

To improve the power stability, this approach may be used with a longer cavity 318, which reduces line spacing 112. If this line spacing is 0.1 nm, multiple wavelengths will be included in the group of wavelengths output by a given ring-resonator filter having a passband of 0.4 nm. For example, a ring-resonator filter having a ring with a small radius (such as between 7-10 µm) and a low Q factor can pick off the group of wavelengths having one to four wavelengths for use in one of optical channels 210 in FIG. 2. (In this case, the passband of the filter is large and the free spectral range may be as large as 20 nm.) Note that when there are multiple laser wavelengths in an optical channel, the tuning of cavity 318 may be less important because the resulting shift of the comb lines may have a smaller impact on the output power of the sliced optical channels. Consequently, a broadband modulator (such as a Mach-Zehnder-interferometer modulator, an electro-absorption modulator or a modulator that has a bandwidth greater than 10 nm) may be able to simultaneously modulate most or all of the wavelengths in a given optical channel. Therefore, as long as the filtering associated with the corresponding ring-resonator filter is aligned with the WDM multiplexer/de-multiplexer in the optical link, drifting of cavity 318 may not have a significant impact on performance. Furthermore, note that in these embodiments the stability of the optical power in the optical channels increases as line spacing 112 decreases.

As shown in FIG. 4, which presents a block diagram illustrating a multiple-wavelength laser source 400, in some embodiments set of ring-resonator filters 328 have free spectral ranges that are N times smaller than bandwidth 114 in FIG. 1. Using the periodic nature of the ring-resonator filters, a given ring-resonator filter picks out a corresponding subset of set of wavelengths 312. As noted previously, the given ring-resonator filter may therefore output multiple groups of wavelengths 330 separated by spacing 410 if these groups of wavelengths are within bandwidth 114 in FIG. 1. Note that spacing 410 may be larger than width 212 in FIG. 2, and this increased spacing may facilitate independent optical modulation of one or more of the groups of wavelengths 330 output by the given ring-resonator filter. Furthermore, depending on the architecture of the given ring-resonator filter and line spacing 112, a given group of wavelengths (such as group of wavelengths 330-1) may include one or more wavelengths (one wavelength is shown in the groups of wavelengths in FIG. 4). In addition, note that, if there is more than one wavelength in a given group of wavelengths, these wavelengths may be separated by line spacing 112.

By cascading multiple ring-resonator filters in this embodiment, in which the rings have slightly different sizes (or in which rings having the same size are tuned to different resonance wavelengths), a multiple-wavelength laser source can be implemented. Note that the sizes of the rings may be chosen so that the free spectral ranges match width 212 in FIG. 2.

In principle, modulators 332 (FIG. 3) and 412 in FIG. 4 can be broadband modulators or narrow-band modulators (such as ring-resonator modulators). When narrow-band modulators are used, cavity 318 may be relatively short, thereby increasing line spacing 112. In addition, the ring-resonator filters may have a radius between 30-100 µm. In these embodiments, each group of wavelengths 330 may include one wavelength from the Fabry-Perot laser comb source (i.e., the ring-resonator filters can pick off individual wavelengths), but the free spectral range is small (1-2 nm), which results in repeats (i.e., multiple groups of wavelengths 330). (Thus, in these embodiments the Q factor is high and the filter passband is small.) Moreover, the groups of wavelengths 330 output by the given ring-resonator filter (which are a subset of the wavelengths 312) having the correct optical-channel spacing (i.e., width 212 in FIG. 2) can then be used to power optical channels 210 (FIG. 2) in the WDM link.

For example, range of wavelengths 314 may be 16 nm and line spacing 112 may be 0.4 nm. Therefore, Fabry-Perot laser 310 may provide 40 single wavelength sources ($\lambda_1$, $\lambda_2$, ... $\lambda_{40}$). (Note that this is in contrast with a mode-locked laser, such as a distributed feedback laser or a grating feedback laser, which mode-locks the laser, thereby forcing the laser to output a single wavelength. Obtaining a multiple-wavelength laser source using a group of such mode-locked lasers is likely to be expensive and complicated.) Furthermore, subsets of these wavelengths, such as subsets ($\lambda_1$, $\lambda_5$, $\lambda_9$, ... $\lambda_{37}$), ($\lambda_2$, $\lambda_6$, $\lambda_{10}$, ... $\lambda_{38}$), ($\lambda_3$, $\lambda_7$, $\lambda_{11}$, ... $\lambda_{39}$), and ($\lambda_4$, $\lambda_8$, $\lambda_{12}$, ... $\lambda_{40}$), can be output by corresponding ring-resonator filters in set of ring-resonator filters 328. Wavelengths in each of these subsets can be independently modulated by modulators 412, and the resulting modulated optical signals can be used to power four WDM links (which each include ten optical channels that each use one of the comb wavelengths) with an optical-channel spacing or width 212 (FIG. 2) of 1.6 nm. These WDM links may be communicated using four separate optical waveguides (not shown).

In this embodiment, most or all of the optical modes output by the Fabry-Perot laser can be used (thus, it is highly efficient). However, in order to obtain stable operation of a high-speed link with high signal integrity, the wavelengths output by Fabry-Perot laser 310 and the resonant wavelengths of set of ring-resonator filters 328 may need to be very stable relative to the resonant wavelengths of the ring-resonator modulators. In particular, because the modulation in ring-resonator modulators is usually associated with a very small ring-resonance shift (on the order of a few tens of pico-meters), the wavelengths for each of the optical channels typically need to have a very narrow line width (such as less than a few pico-meters). Therefore, this embodiment may use highly accurate tuning of these components.

Alternatively, if broadband modulators are used to encode data on the outputs from set of ring-resonator filters 328 (such as a Mach-Zehnder-interferometer modulator, an electro-absorption modulator, and/or a modulator that has a bandwidth greater than 10 nm), a similar approach may be used to power modulators 412 with one of the comb wavelengths. However, in these embodiments the laser-source line widths may be relaxed to sub-nano-meters if the transmission is high-speed (e.g., greater than 10 Gbps) and is over short distances.

In order to use most (or all) of the spectral components output by Fabry-Perot laser 310, and to reduce any tuning, set of ring-resonator filters 328 may be higher-order filters that have transfer functions with a flat top and a sharp roll-off. This may facilitate slicing out multiple laser comb wavelengths into one optical channel, which allows the filters to be closely spaced in the wavelength domain, thereby reducing or eliminating wasted comb lines between the ring-resonator filters.

Furthermore, in some embodiments the multiple-wavelength laser source includes a polarization-control element that stabilizes polarization over range of wavelengths 314. For example, an optional polarization-control element 336 may be between Fabry-Perot laser 310 and optical waveguide 326. Alternatively, the polarization-control element may be included in Fabry-Perot laser 310. In these latter embodiments, the polarization-control element may be included in reflecting mirror 322 and/or partially reflecting mirror 324. Note that in some embodiments optical waveguide 326 selects the polarization over range of wavelengths 314.

Figure 5:
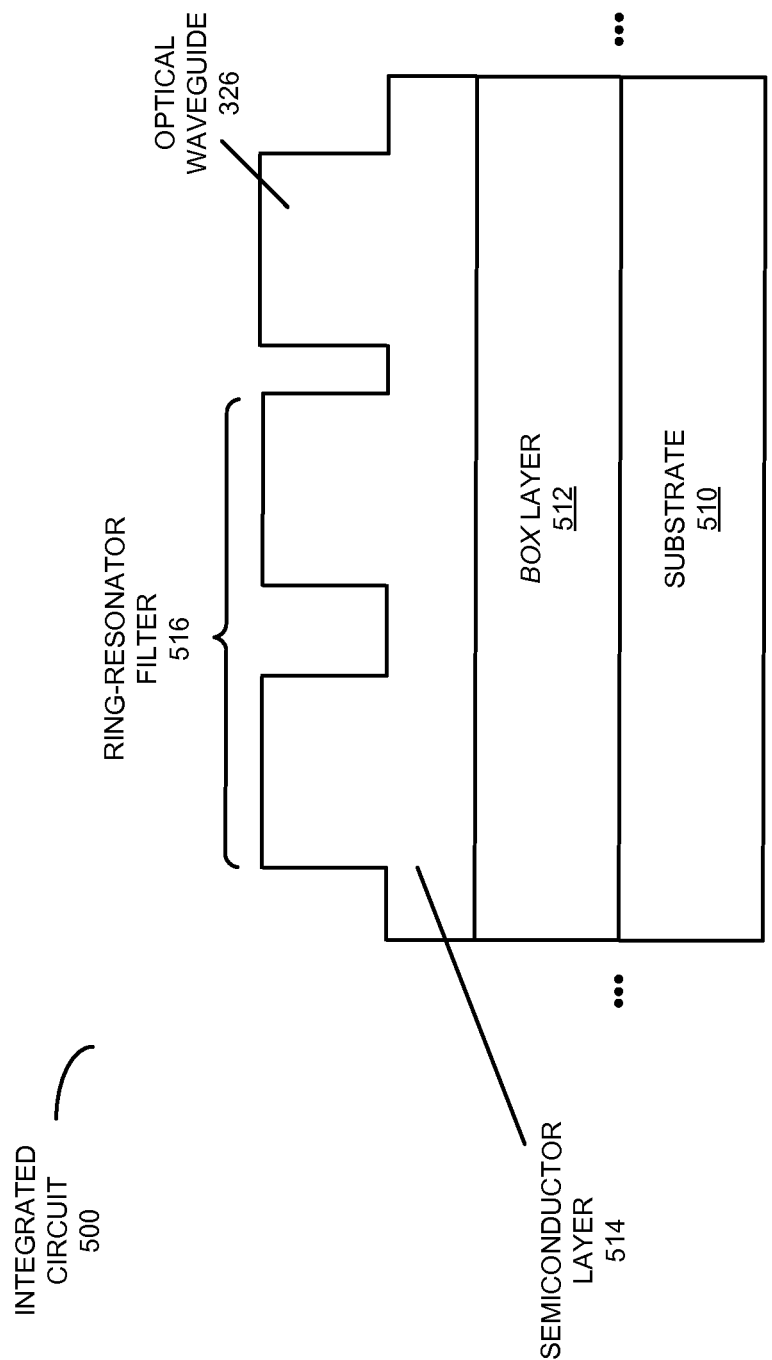
FIG. 5 is a block diagram illustrating an integrated circuit in accordance with an embodiment of the present disclosure.

At least portions of the multiple-wavelength laser source may be implemented in an integrated circuit. This is shown in FIG. 5, which presents a block diagram illustrating an integrated circuit 500. In particular, optical waveguide 326 and set of ring-resonator filters 328 (such as ring-resonator filter 516) may be defined in a semiconductor layer 514 in integrated circuit 500. Furthermore, semiconductor layer 514 may be disposed on a buried-oxide layer (BOX) 512, which is deposited on substrate 510. Note that substrate 510 may include silicon, buried-oxide layer 512 may include a dielectric or an oxide (such as silicon dioxide), and/or semiconductor layer 514 may include silicon. Therefore, substrate 510, buried-oxide layer 512 and semiconductor layer 514 may constitute a silicon-on-insulator (SOI) technology. In some embodiments, the silicon in semiconductor layer 514 is 0.5 μm thick, and the silicon-dioxide layer may have a thickness between 0.1 and 10 μm.

Figure 6:
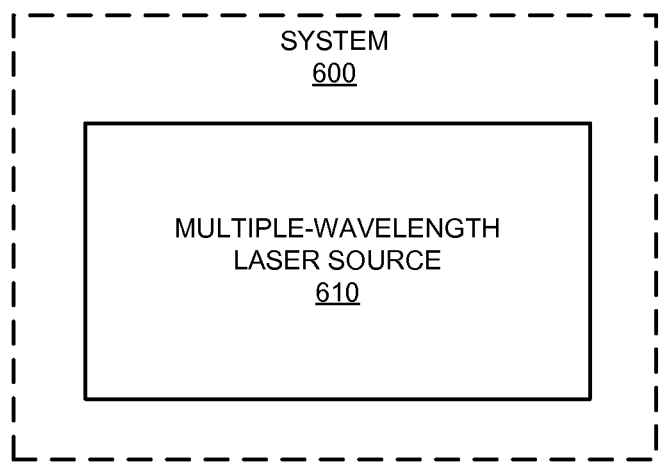
FIG. 6 is a block diagram illustrating a system that includes a multiple-wavelength laser source in accordance with an embodiment of the present disclosure.

One or more of the preceding embodiments of the multiple-wavelength laser source may be included in a system and/or an electronic device. This is shown in FIG. 6, which presents a block diagram illustrating a system 600 that includes a multiple-wavelength laser source 610, such as multiple-wavelength laser source 300 (FIG. 3) or 400 (FIG. 4).

The multiple-wavelength laser source may be used in a variety of applications, including: VLSI circuits, communication systems (such as WDM), storage area networks, data centers, networks (such as local area networks), and/or computer systems (such as multiple-core processor computer systems). Note that system 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

Multiple-wavelength laser source 300 (FIG. 3), multiple-wavelength laser source 400 (FIG. 4), integrated circuit 500 (FIG. 5) and/or system 600 may include fewer components or additional components. For example, semiconductor layer 514 in FIG. 5 may include poly-silicon or amorphous silicon. Furthermore, a wide variety of fabrication techniques may be used to fabricate the multiple-wavelength laser source in the preceding embodiments, as known to one of skill in the art. In addition, a wide variety of optical components may be used in the multiple-wavelength laser source (such as alternative optical filters that replace ring-resonator filters 328 in FIGS. 3 and 4).

Although these embodiments are illustrated as having a number of discrete items, the embodiments of the multiple-wavelength laser source, the integrated circuit and the system are intended to be functional descriptions of the various features that may be present rather than structural schematics of the embodiments described herein. Consequently, in these embodiments two or more components may be combined into a single component, and/or a position of one or more components may be changed.

Figure 7:
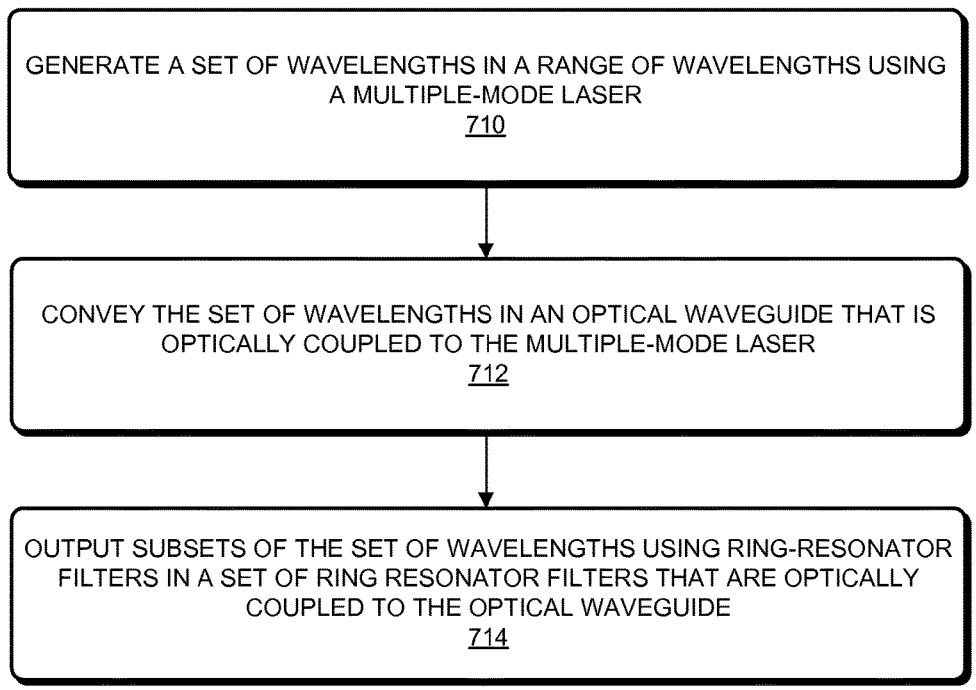
FIG. 7 is a flow chart illustrating a method for outputting a set of wavelengths in accordance with an embodiment of the present disclosure.

We now describe the method. FIG. 7 presents a flow chart illustrating a method 700 for outputting a set of wavelengths. During this method, a set of wavelengths in a range of wavelengths are generated using a multiple-mode laser (operation 710), where a first spacing between a pair of adjacent wavelengths in the set of wavelengths is smaller than a width of a given channel in an optical link. Then, the set of wavelengths is conveyed in an optical waveguide that is optically coupled to the laser (operation 712). Next, subsets of the set of wavelengths are output by ring-resonator filters that are optically coupled to the optical waveguide (operation 714). For example, a first subset of the set of wavelengths are output for use in the optical link using a first ring-resonator filter coupled to the optical waveguide, and a second subset of the set of wavelengths are output for use in the optical link using a second ring-resonator filter coupled to the optical waveguide. Note that the first subset of the set of wavelengths is output based on a first free spectral range and a first quality factor of the first ring-resonator filter, and the second subset of the set of wavelengths is output based on a second free spectral range and a second quality factor of the second ring-resonator filter.

Furthermore, a given subset of the set of wavelengths includes at least a first group of wavelengths and, if the given subset of the set of wavelengths includes an adjacent second group of wavelengths, a second spacing between the first group of wavelengths and the second group of wavelengths is larger than the width of the given channel in the optical link. Additionally, the given group of wavelengths includes at least a first wavelength and, if the given group of wavelengths includes an adjacent second wavelength, the first wavelength and the second wavelength are separated by the first spacing, thereby facilitating optical modulation of the first group of wavelengths and the second group of wavelengths in the given subset of the set of wavelengths.

In some embodiments of method 700, there may be additional or fewer operations. Moreover, the order of the operations may be changed, and/or two or more operations may be combined into a single operation.

While the preceding embodiments illustrate the use of the multiple-wavelength laser source in conjunction with an optical link, the multiple-wavelength laser source may be used in applications other than communications, such as: manufacturing (cutting or welding), a lithographic process, data storage (such as an optical-storage device or system), medicine (such as a diagnostic technique or surgery), a barcode scanner, entertainment (a laser light show), and/or metrology (such as precision measurements of distance).

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A multiple-wavelength laser source, comprising:
 a multiple-mode laser configured to output a set of wavelengths in a range of wavelengths, with a first spacing between a given pair of adjacent wavelengths in the set of wavelengths that is smaller than a width of a given channel in an optical link, wherein the multiple-mode laser includes:
  a gain medium; and
  a cavity, surrounding the gain medium, having a first end with a reflecting mirror over the range of wavelengths and a second end with a partially reflecting mirror over the range of wavelengths;
 an optical waveguide optically coupled to the second end; and
 a set of ring-resonator filters optically coupled to the optical waveguide, wherein a given ring-resonator filter in the set of ring-resonator filters is configured to output a corresponding subset of the set of wavelengths for use in the optical link based on a free spectral range and a quality factor of the given ring-resonator filter;

wherein the subset of wavelengths includes a first group of wavelengths;
wherein the first group of wavelengths includes at least a first wavelength and an adjacent second wavelength, wherein the first wavelength and the second wavelength are separated by the first spacing; and
wherein a broadband modulator is configured to modulate the first group of wavelengths, wherein the broadband modulator has a bandwidth greater than 10 nm.

2. The multiple-wavelength laser source of claim 1, wherein the channel width is approximately 1.6 nm and the first spacing is less than 1 nm.

3. The multiple-wavelength laser source of claim 1, wherein the first group of wavelengths is associated with a first channel in the optical link.

4. The multiple-wavelength laser source of claim 3, further comprising:
the broadband modulator configured to optically modulate the first group of wavelengths and configured to output an optically modulated first group of wavelengths onto the optical link.

5. The multiple-wavelength laser source of claim 1, wherein the first group of wavelengths is associated with a channel in the optical link.

6. The multiple-wavelength laser source of claim 5, further comprising:
the broadband modulator configured to optically modulate a first subset of the set of wavelengths and configured to output a modulated first subset of the set of wavelengths;
a second broadband modulator configured to independently optically modulate a second subset of the set of wavelengths and configured to output a modulated second subset of set of wavelengths; and
a combiner configured to combine the modulated first subset of the set of wavelengths and the modulated second subset of the set of wavelengths and configured to output a combined optical signal onto the optical link.

7. The multiple-wavelength laser source of claim 1, wherein the multiple-wavelength laser source is disposed on an integrated circuit.

8. The multiple-wavelength laser source of claim 7, wherein the optical waveguide and the set of ring-resonator filters are defined in a semiconductor layer in the integrated circuit.

9. The multiple-wavelength laser source of claim 1, wherein the multi-mode laser includes a Fabry-Perot laser.

10. The multiple-wavelength laser source of claim 8, further comprising:
a substrate; and
a buried-oxide layer deposited on the substrate, wherein the semiconductor layer is disposed on the buried-oxide layer.

11. The multiple-wavelength laser source of claim 1, further comprising a polarization-control element between the multiple-mode laser and the optical waveguide, wherein the polarization-control element is configured to stabilize polarization over the range of wavelengths.

12. The multiple-wavelength laser source of claim 1, wherein the multiple-mode laser includes a polarization-control element, wherein the polarization-control element is configured to stabilize polarization over the range of wavelengths.

13. The multiple-wavelength laser source of claim 12, wherein the polarization-control element is included in at least one of the reflecting mirror and the partially reflecting mirror.

14. The multiple-wavelength laser source of claim 1, wherein the optical waveguide is configured to select a polarization over the range of wavelengths.

15. The multiple-wavelength laser source of claim 1, wherein the free spectral range of the given ring-resonator filter corresponds to a size of the given ring-resonator filter.

16. The multiple-wavelength laser source of claim 1, wherein the quality factor of the given ring-resonator filter corresponds to an optical coupling between the optical waveguide and the given ring-resonator filter and a round-trip optical loss in the given ring-resonator filter.

17. A system, comprising a multiple-wavelength laser source, wherein the multiple-wavelength laser source includes:
a multiple-mode laser configured to output a set of wavelengths in a range of wavelengths, with a first spacing between a given pair of adjacent wavelengths in the set of wavelengths that is smaller than a width of a given channel in an optical link, wherein the multiple-mode laser includes:
a gain medium; and
a cavity, surrounding the gain medium, having a first end with a reflecting mirror over the range of wavelengths and a second end with a partially reflecting mirror over the range of wavelengths;
an optical waveguide optically coupled to the second end; and
a set of ring-resonator filters optically coupled to the optical waveguide, wherein a given ring-resonator filter in the set of ring-resonator filters is configured to output a corresponding subset of the set of wavelengths for use in the optical link based on a free spectral range and a quality factor of the given ring-resonator filter,
wherein the subset of wavelengths includes a first group of wavelengths, and
wherein the first group of wavelengths includes at least a first wavelength and an adjacent second wavelength, wherein the first wavelength and the second wavelength are separated by the first spacing; and
wherein a broadband modulator is configured to modulate the first group of wavelengths, wherein the broadband modulator has a bandwidth greater than 10 nm.

18. A method for outputting a set of wavelengths, comprising:
generating the set of wavelengths in a range of wavelengths using a multiple-mode laser, wherein a first spacing between a pair of adjacent wavelengths in the set of wavelengths is smaller than a width of a given channel in an optical link;
conveying the set of wavelengths in an optical waveguide that is optically coupled to the multiple-mode laser; and
outputting, for use in the optical link, a first subset of the set of wavelengths using a first ring-resonator filter coupled to the optical waveguide and a second subset of the set of wavelengths using a second ring-resonator filter coupled to the optical waveguide,
wherein the first subset of the set of wavelengths is output based on a first free spectral range and a first quality factor of the first ring-resonator filter and the second subset of the set of wavelengths is output based on a second free spectral range and a second quality factor of the second ring-resonator filter, wherein a given subset of the set of wavelengths, which can include the first subset of the set of wavelengths or the second subset of the set of wavelengths, includes a first group of wavelengths, and wherein the first group of wavelengths includes at least a first wavelength and an adjacent second wavelength, wherein the first wavelength and the second wavelength are separated by the first spacing; and wherein a broadband modulator is configured to modulate the first group of wavelengths, wherein the broadband modulator has a bandwidth greater than 10 nm.

* * * * *